(12) United States Patent
Lin et al.

(10) Patent No.: US 12,388,413 B2
(45) Date of Patent: Aug. 12, 2025

(54) ACOUSTIC WAVE DEVICE WITH ENHANCED QUALITY FACTOR AND FABRICATION METHOD THEREOF

(71) Applicant: RichWave Technology Corp., Taipei (TW)

(72) Inventors: Shih-Meng Lin, Taipei (TW); Shih-Che Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 727 days.

(21) Appl. No.: 17/842,801

(22) Filed: Jun. 17, 2022

(65) Prior Publication Data

US 2023/0344402 A1 Oct. 26, 2023

(30) Foreign Application Priority Data

Apr. 21, 2022 (TW) .................................. 111115146

(51) Int. Cl.
*H03H 9/02* (2006.01)
(52) U.S. Cl.
CPC .... *H03H 9/02574* (2013.01); *H03H 9/02992* (2013.01)
(58) Field of Classification Search
CPC ........... H03H 9/02157; H03H 9/02574; H03H 9/02622; H03H 9/02858; H03H 9/02881; H03H 9/02992
See application file for complete search history.

(56) References Cited

U.S. PATENT DOCUMENTS

| 6,516,503 | B1 | 2/2003 | Ikada | |
|---|---|---|---|---|
| 7,112,860 | B2 | 9/2006 | Saxler | |
| 10,958,236 | B2* | 3/2021 | Li | H03H 9/02228 |
| 2021/0091747 | A1* | 3/2021 | Turner | H03H 9/173 |

FOREIGN PATENT DOCUMENTS

| CN | 114208036 A | 3/2022 |
|---|---|---|
| TW | 200511714 | 3/2005 |
| TW | 202103345 A | 1/2021 |
| TW | 202125972 A | 7/2021 |

OTHER PUBLICATIONS

Notice of Allowance mailed on Jan. 11, 2023 for the Taiwan application No. 111115146, filing date Apr. 21, 2022, pp. 1-6.

* cited by examiner

*Primary Examiner* — Naishadh N Desai
(74) *Attorney, Agent, or Firm* — Winston Hsu

(57) ABSTRACT

An acoustic wave device includes a piezoelectric substrate, a transducer, and a depression. The transducer is disposed on a surface of the piezoelectric substrate, and includes a first bus bar, a first electrode, a second bus bar, and a second electrode. The first bus bar and the second bus bar extend along a second direction. The first electrode has a first end and extends from the first bus bar along a first direction. The first electrode and the second electrode are spaced apart from each other, and a gap is formed between the first end of the first electrode and an edge of the second bus bar. The depression is formed in the piezoelectric substrate and is depressed from the surface of the piezoelectric substrate. The first end of the first electrode is continuously joined to a sidewall of the depression along a depth direction.

20 Claims, 8 Drawing Sheets

ACOUSTIC WAVE DEVICE WITH ENHANCED QUALITY FACTOR AND FABRICATION METHOD THEREOF

TECHNICAL FIELD

The present invention relates to radio frequency communication, and in particular, to an acoustic wave device with enhanced quality factor in radio frequency communication and a fabrication method thereof.

BACKGROUND

A surface acoustic wave (SAW) device may be used for converting and transmitting electrical signals and acoustic signals. The SAW filters are used in many applications. For example, the SAW filters can filter out noise and reserve wireless signals in the desired frequency bands, offering a low transmission loss and excellent performance in anti-electromagnetic interference while being compact in size, and thus providing wide uses in various communication products. However, conventional SAW filters may suffer from energy leakage, resulting in degradation in quality factor. In addition, the SAW filters can also serve as resonators.

SUMMARY

According to an embodiment of the invention, an acoustic wave device includes a piezoelectric substrate having a first surface, a transducer disposed on the first surface of the piezoelectric substrate, and a first depression formed in the piezoelectric substrate and depressed from the first surface of the piezoelectric substrate. The transducer includes a first bus bar extending along a second direction, a first electrode having a first end and extending from the first bus bar to the first end along a first direction, a second bus bar extending along the second direction, and a second electrode having a second end and extending from the second bus bar to the second end along the first direction. The second electrode and the first electrode may be spaced apart in the second direction, and a first gap may be formed between the first end of the first electrode and an edge of the second bus bar. The first depression has a first sidewall, and the first end of the first electrode is continuously joined to the first sidewall of the first depression in a depth direction.

According to another embodiment of the invention, a method of fabricating an acoustic wave device includes providing a piezoelectric substrate having a first surface, forming a conductive layer on the first surface, and patterning the conductive layer to form a patterned conductive layer. The patterned conductive layer includes a first bus bar extending along a second direction, a first electrode having a first end extending from the first bus bar to the first end along a first direction, a second bus bar extending along the second direction, and a second electrode having a second end and extending from the second bus bar to the second end along the first direction. The second electrode and the first electrode may be spaced apart in the second direction, and a first gap may be formed between the first end of the first electrode and an edge of the second bus bar. The method further includes forming a first depression in the piezoelectric substrate, the first depression is depressed from the first surface of the piezoelectric substrate, and the first depression includes a first sidewall. The first end of the first electrode may be continuously joined to the first sidewall of the first depression in a depth direction.

DETAILED DESCRIPTION

Figure 1:
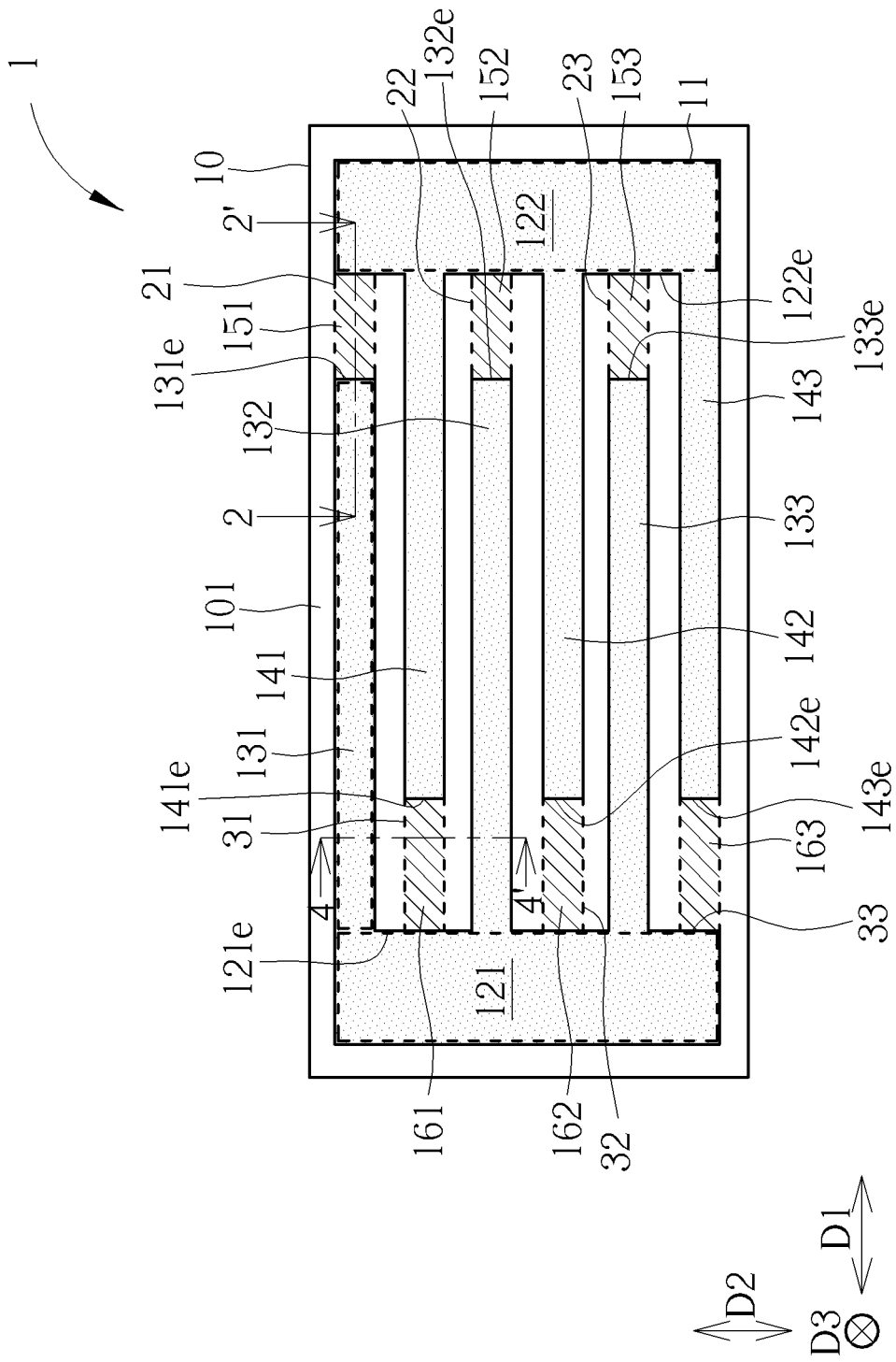
FIG. 1 is a top view of an acoustic wave device according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a top view of an acoustic wave device 1 according to an embodiment of the invention. In some embodiments, the acoustic wave device 1 may be a surface acoustic wave (SAW) filter. For example, the acoustic wave device 1 may receive an RF signal transmitted from an antenna, convert the RF signal into an acoustic wave, process the acoustic wave to generate a filtered signal, and output the filtered signal. The RF signal and the filtered signal are electrical signals. The applications of the SAW device 1 are not limited to the embodiments of the disclosure, and may also be used in other applications.

In some embodiments, the acoustic wave device 1 may include a piezoelectric substrate 10 and a transducer 11 disposed on the surface of the piezoelectric substrate 10. The piezoelectric substrate 10 may include a substrate and a piezoelectric material layer disposed on the substrate. For example, the substrate of the piezoelectric substrate 10 may include a silicon substrate. The piezoelectric material layer may include piezoelectric single crystals, piezoelectric polycrystals (including piezoceramics), piezoelectric polymers, and piezoelectric composite materials. For example, the piezoelectric material layer may include zinc oxide (ZnO), aluminum nitride (AlN), lithium tantalate (LiTaO$_3$) and any combination thereof. The transducer 11 may include a metallic material, and the metallic material may include molybdenum (Mo), copper (Cu), aluminum (Al), gold (Au), platinum (Pt), tungsten (W), and any combination thereof.

In some embodiments, the transducer 11 may be disposed on the surface 101 of piezoelectric substrate 10 and may include bus bar 121, electrodes 131-133, bus bar 122, and electrodes 141-143. As shown in FIG. 1, the bus bar 121 may extend along the direction D2. The electrodes 131 to 133 have ends 131e to 133e, respectively, and may extend from the bus bar 121 respectively to the ends 131e to 133e along the direction D1. Similarly, the bus bar 122 may extend along the direction D2. The electrodes 141 to 143 have ends 141e to 143e, respectively, and may extend from the bus bar 122 respectively to the ends 141e to 143e along the direction D1. The electrodes 141 to 143 are spaced apart from the electrodes 131 to 133 along the direction D2, respectively. For example, the electrode 141 is spaced apart from the electrode 131 along the direction D2. The electrodes 131 to 133 may be parallel to the electrodes 141 to 143, and the bus bar 121 may be parallel to the bus bar 122. In the embodiment, the direction D2 may be, but is not limited to, perpendicular to the direction D1, and both the direction D1 and the direction D2 are parallel to the surface 101 of the piezoelectric substrate 10. In other embodiments, an angle other than 90 degrees may be formed between the direction D2 and the direction D1.

In some embodiments, first gaps may be formed between the ends 131e to 133e of the electrodes 131 to 133 and the edge 122e of the bus bar 122, respectively. Second gaps may be formed between the ends 141e to 143e of the electrodes 141 to 143 and the edge 121e of the bus bar 121, respectively. The first gaps may have identical or different size(s) along the direction D1, and/or the second gaps may have identical or different size(s) along the direction D1. For example, the ends 131e-133e may be aligned with each other along direction D2, and/or the ends 141e-143e may be aligned with each other along direction D2.

The bus bar 121 and the electrodes 131 to 133 may form a first set of interdigital structures, the bus bar 122 and the electrodes 141 to 143 may form a second set of interdigital structures, and the first set of interdigital structures and the second set of interdigital structures may be arranged interdigitally. In some embodiments, the materials of the electrodes 131 to 133, the electrodes 141 to 143, the bus bar 121, and the bus bar 122 include a metal, and the metal may be selected from at least one of the following: molybdenum (Mo), copper (Cu), aluminum (Al)), gold (Au), platinum (Pt), tungsten (W), and a combination thereof.

In some embodiments, the transducer 11 may function as an input transducer or an output transducer. Taking the input transducer as an example, the electrical signal may be input via the bus bar 121/122, and may be converted into an acoustic signal by the piezoelectric substrate 10 and the electrodes 131, 141, 132, 142, 133, and 143 thereon. The acoustic signal may propagate along the direction D2. In other embodiments, the transducer 11 may also be used as an output transducer for converting an acoustic signal into an electrical signal. The ends 131e to 133e may be aligned along the direction D2 and the ends 141e to 143e may be aligned along the direction D2. An imaginary line connecting the aligned ends 131e to 133e and another imaginary line connecting the aligned ends 141e to 143e may be used to define an effective transmission area for the acoustic signal. Specifically, taking the directions shown in FIG. 1 as an example, the imaginary line connecting the ends 131e, 132e, and 133e may be regarded as the first boundary of the effective transmission area for the acoustic signal, and the imaginary line connecting the ends 141e, 142e, and 143e may be regarded as the second boundary of the effective transmission area. In some embodiments, the SAW device 1 may operate in a piston mode, such that energy may not leak or may leak insignificantly through, for example, first gaps between electrodes 131 to 133 and the bus bar 122, and/or second gaps between the electrodes 141 to 143 and the bus bar 121.

Figure 2A:
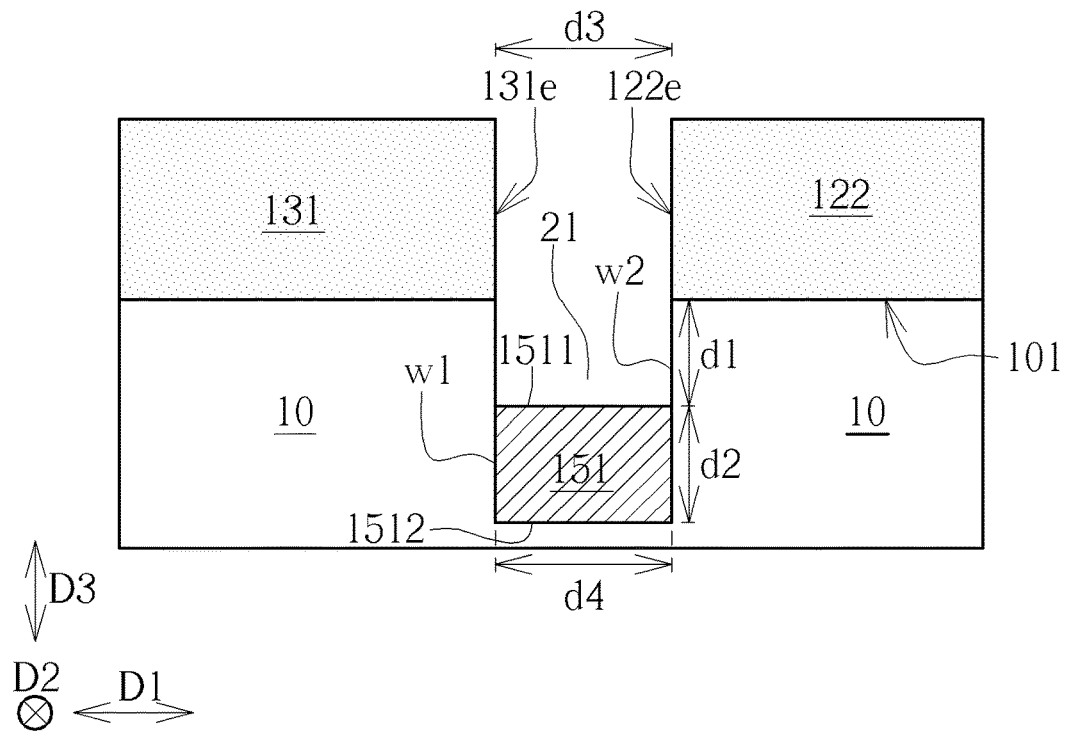
FIGS. 2A to 2C show cross-sectional views of the acoustic wave device in FIG. 1 along Line 2-2'.
Figure 2B:
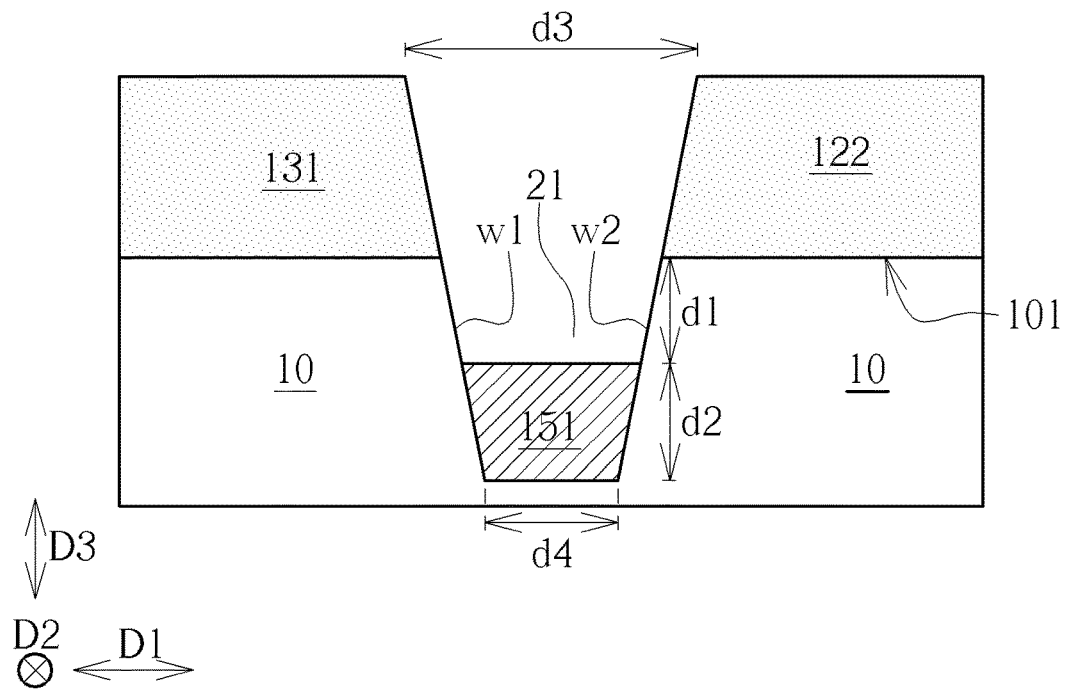
Figure 2C:
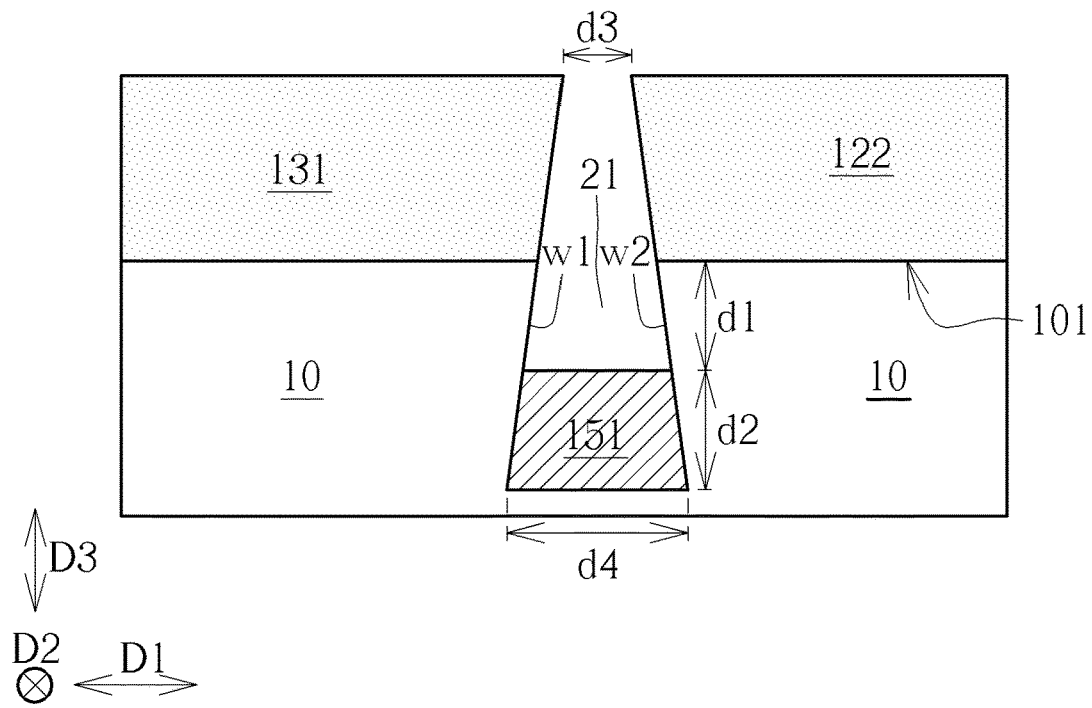

FIGS. 2A to 2C show cross-sectional views of the acoustic wave device 1 along Line 2-2'. Referring to FIG. 1 and FIG. 2A, in some embodiments, the acoustic wave device 1 may further include a depression 21 positioned corresponding to the first gap between the electrode 131 and the bus bar 122. Further, the depression 21 may be positioned corresponding to the first gap between the end 131e of the electrode 131 and the edge 122e of the bus bar 122. In FIG. 2A, the depression 21 may be formed in the piezoelectric substrate 10 and depressed, for example, along the direction D3, from the surface 101 of the piezoelectric substrate 10. The depression 21 has a first sidewall w1 and a second sidewall w2. In the direction D3, the end 131e of the electrode 131 is continuously joined to the first sidewall w1 of the depression 21. Further, the edge 122e of the bus bar 122 may be continuously joined to the second sidewall w2 of the depression 21. Similar to the depression 21, the acoustic wave device 1 may further include depressions 22 to 23, and the depressions 22 to 23 may be positioned corresponding to the first gaps between the ends 132e to 133e of the electrodes 132 to 133 and the edge 122e of the bus bar 122, respectively. Each of the depressions 22 to 23 may be formed in the piezoelectric substrate 10 and depressed from the surface 101 of the piezoelectric substrate 10, for example, in the direction D3.

In FIG. 1, the acoustic wave device 1 may further include depressions 31 to 33 corresponding to the second gaps between the electrodes 141 to 143 and the bus bar 121, respectively. The configurations of the depressions 31 to 33 may be similar to those of depressions 21 to 23 with the difference in that the depressions 31 to 33 are positioned corresponding to the second gaps between the ends 141e to 143e of the electrodes 141 to 143 and the edge 121e of the bus bar 121, respectively. For example, the depression 31 may have a third sidewall and a fourth sidewall. In the direction D3, the end 141e of the electrode 141 may be continuously joined to the third sidewall of the depression 31. Further, the edge 121e of the bus bar 121 may be continuously joined to the fourth sidewall of the depression 31. In the embodiment, the direction D3 may be perpendicular to the direction D1 and the direction D2.

Referring to FIG. 1 and FIG. 2A, in some embodiments, the acoustic wave device 1 may further include a metal fill 151. In FIG. 2A, the metal fill 151 may be filled in the depression 21 of the piezoelectric substrate 10, and the metal fill 151 may have a metal fill surface 1511 and a metal fill bottom 1512. A distance between the surface 101 and the metal fill surface 1511 along the direction D3 is referred to as d1. Furthermore, a thickness between the metal fill surface 1511 and the metal fill bottom 1512 is referred to as d2, and the distance d1 and the thickness d2 are greater than zero. In FIG. 1, similar to the metal fill 151, the acoustic wave device 1 may further include metal fills 152 to 153 filled in the depressions 22 to 23, respectively. Further, the acoustic wave device 1 may include metal fills 161 to 163 filled in the depressions 31 to 33, respectively. In some embodiments, the arrangement of the metal fills 152 to 153, 161 to 163 with respect to the depressions 22 to 23, 31 to 33, respectively, may be similar to the arrangement of the metal fill 151 with respect to the depression 21, and the explanation therefor is not repeated here for brevity.

In the embodiments, the transducer 11 and the metal fill may contain the same or different metals. For example, the metal fills 151 to 153 and 161 to 163 may include metals, and the metals may be selected from at least one of the following: molybdenum (Mo), copper (Cu), aluminum (Al)), gold (Au), platinum (Pt), tungsten (W), and a combination thereof. In such cases, the material density of the metal fill may be greater than that of the piezoelectric substrate 10, that is, the weight of the metal fill may be greater than that of the piezoelectric substrate 10 of the same volume. Therefore, the metal fills 151 to 153 and 161 to 163 in the depressions 21 to 23 and 31 to 33 may form weight loads at the ends of the electrodes. When the acoustic wave device 1 is in operation, the weight loads formed by the metal fills in the depressions 21 to 23 and 31 to 33 may block the prorogation of the acoustic signal along the direction D1 (that is, reducing or stopping the prorogation of the acoustic signal along the direction D1), thus reducing or eliminating the energy leakage of the acoustic signal through the first gaps or the second gaps, such that most or all the energy of the acoustic signal may be transmitted along the direction D2. Therefore, the quality factor (Q) of the acoustic wave device 1 is enhanced.

The configuration of the metal fill 151 and the depression 21 are explained in detail in the subsequent paragraphs. The configuration of other metal fills and depressions may be similar to the metal fill 151 and the depression 21, and explanation therefor will be omitted for brevity. In some embodiments, the first gap formed between the end 131e of the electrode 131 and the edge 122e of the bus bar 122 has a top size d3 along the direction D1, and the depression 21 has a bottom size d4 along the direction D1. The ratio of the top size d3 of the first gap to the bottom size d4 of the depression 21 may be between 0.8 and 1.2. FIG. 2A shows that the ratio of the top size d3 of the first gap to the bottom size d4 of the depression 21 may be substantially equal to 1, that is, the top size d3 of the first gap is substantially equal to the bottom size d4 of the depression 21. In such a case, the first gap and the depression 21 may have a rectangular profile. However, the profiles are not such limited. In some embodiments, as in FIG. 2B, the ratio of the size d3 to the size d4 is approximately equal to 1.2. In such a case, the first gap and the depression 21 may have a profile of an inverted trapezium. In FIG. 2C, the ratio of size d3 to size d4 is approximately equal to 0.8. In such a case, the first gap and the depression 21 may have a profile of a trapezium.

In some embodiments, the acoustic wave device 1 may be used to process acoustic signals with a wavelength λ. In some embodiments, the distance d1 may be in the range of 5% to 10% of the wavelength λ, such that the metal fill 151 do not contact the electrode 131 or the bus bar 122, so as to prevent a short circuit from being formed between the metal fill 151 and the electrode 131, and/or between the metal fill 151 and the bus bar 122. Furthermore, the thickness d2 may be related to the wavelength λ. For example, the thickness d2 may be 2%-6% of the wavelength λ, such as 4% of the wavelength λ, so as to effect favorably to block the acoustic signal from transmitting along the direction D1. For example, the wavelength λ may be 2 µm, the distance d1 may be between 0.1 µm and 0.2 µm, and the thickness d2 may be equal to 0.08 µm.

Figure 3:
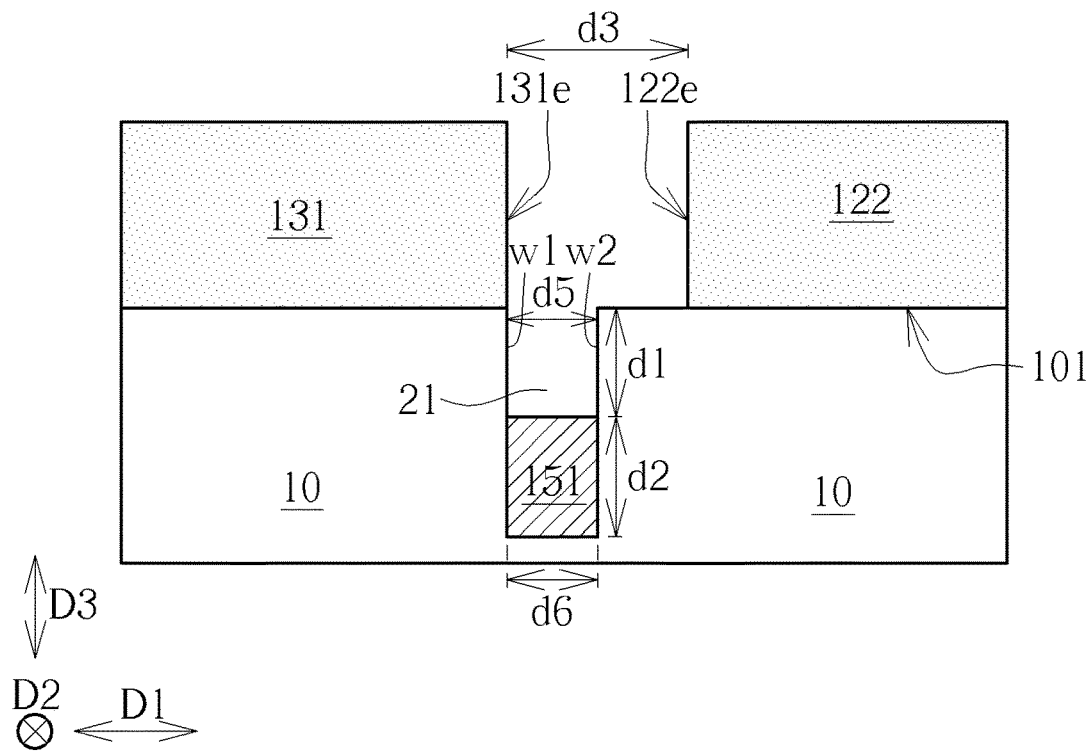
FIG. 3 is a schematic diagram of the depression in the acoustic wave device in FIG. 1 according to another embodiment of the invention.

In FIGS. 2A to 2C, the edge 122e of the bus bar 122 may be, but is not limited to, continuously joined to the second sidewall w2 of the depression 21. FIG. 3 is a schematic diagram of the depression 21 of the acoustic wave device 1 according to another embodiment of the invention, and may be used to replace the depressions 21 in FIGS. 2A to 2C. In FIG. 3, the edge 122e of the bus bar 122 and the second sidewall w2 of the depression 21 may not be continuously joined. For example, the edge 122e of the bus bar 122 and the second sidewall w2 of the depression 21 may form a step at the surface 101 of the piezoelectric substrate 10. Specifically, the depression 21 may have a size d5 along the direction D1 at the surface 101 of the piezoelectric substrate 10, and the size d5 may be less than the top size d3 along the direction D1 of the first gap, and/or equal to a bottom size d6 along the direction D1 of the depression 21. The configuration of the metal fill 151 in FIG. 3 is similar to that in FIG. 2A, and the explanation therefor will not be repeated here.

Figure 4A:
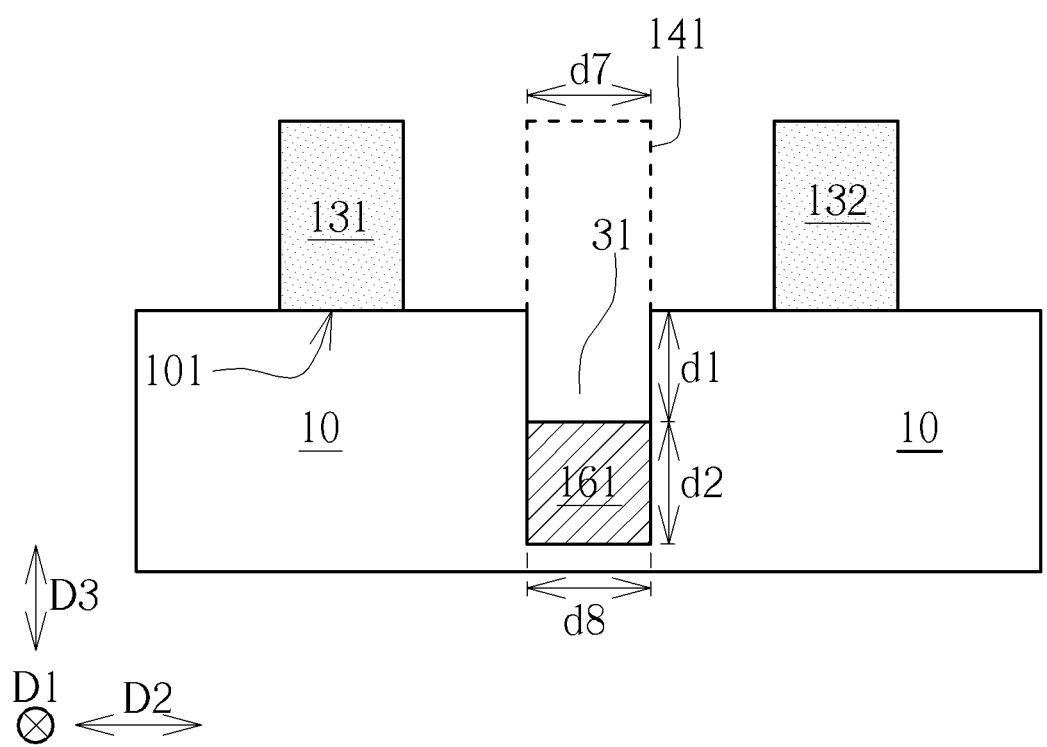
FIGS. 4A to 4C show cross-sectional views of the acoustic wave device in FIG. 1 along Line 4-4'.
Figure 4B:
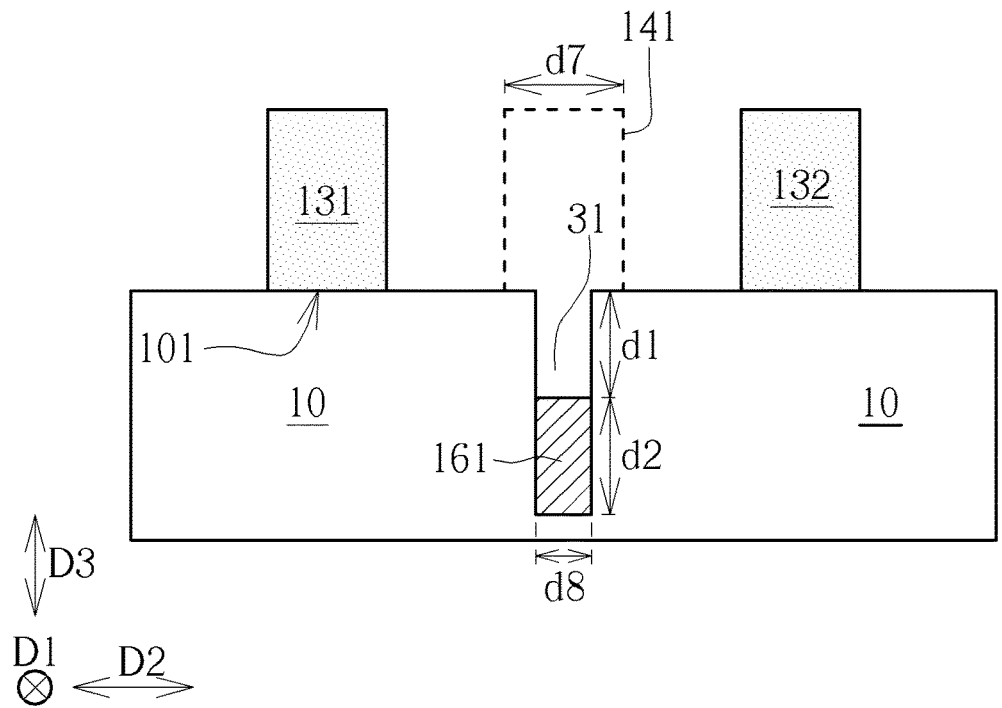
Figure 4C:
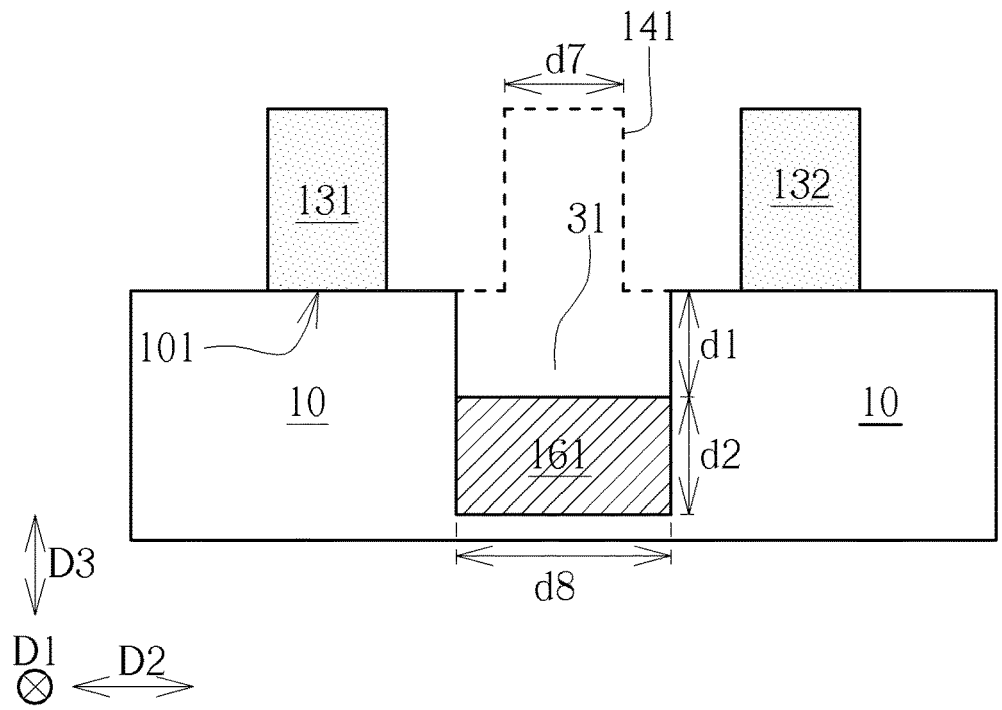

The configuration of the metal fill 161 and the depression 31 will be explained in detail in the subsequent paragraphs, and the configuration of other metal fills and depressions may be similar, and explanation therefor will be omitted for brevity. FIGS. 4A to 4C show cross-sectional views of the acoustic wave device 1 along Line 4-4'. The electrode 141 may have a size d7 along the direction D2, and the depression 31 may have a size d8 along the direction D2. The size d8 of the depression 31 may be equal to (FIG. 4A), smaller (FIG. 4C), or larger (FIG. 4B) than the size d7 of the electrode 141. The larger the size d8 is, the larger the volume of the metal fill 161 may be and the heavier weight load is. Therefore, the quality factor of the acoustic wave device 1 is enhanced.

Figure 5:
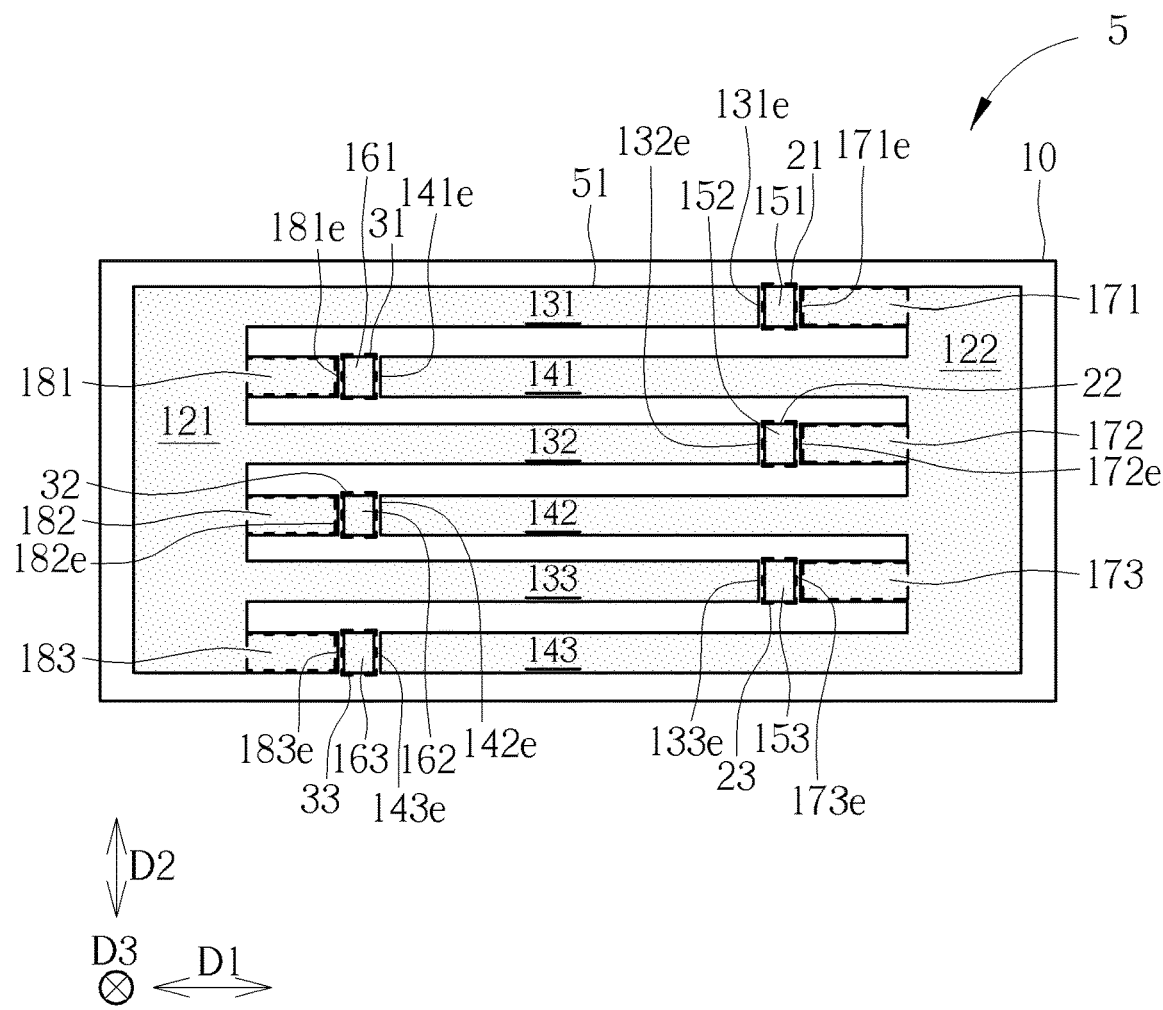
FIG. 5 is a top view of an acoustic wave device according to another embodiment of the invention.

FIG. 5 is a top view of an acoustic wave device 5 according to another embodiment of the invention. The acoustic wave device 5 may include the piezoelectric substrate 10, a transducer 51, depressions 21 to 23 and 31 to 33, and metal fills 151 to 153 and 161 to 163. The acoustic wave device 5 and the acoustic wave device 1 are different in that the transducer 51 further includes dummy electrodes 171 to 173 and dummy electrodes 181 to 183. The dummy electrodes 171 to 173 have dummy ends 171e to 173e, respectively, and may extend from the bus bar 122 to the dummy ends 171e to 173e along the direction D1, respectively. The dummy electrodes 181 to 183 have dummy ends 181e to 183e, respectively, and may extend from the bus bar 121 to the dummy ends 181e to 183e along the direction D1, respectively. The dummy ends 171e to 173e of the dummy electrodes 171 to 173 may be aligned along the direction D1 with the ends 131e to 133e of the electrodes 131 to 133, respectively, and the dummy ends 181e to 183e of the dummy electrodes 181 to 183 may be aligned along the direction D1 with the ends 141e to 143e of the electrodes 141 to 143, respectively. Further, the dummy ends 171e to 173e may be aligned with each other along the direction D2, and the dummy ends 181e to 183e may be aligned with each other along the direction D2. In FIG. 5, the first gaps may be formed between the ends 131e to 133e of the electrodes 131 to 133 and the dummy ends 171e to 173e of the dummy electrodes 171 to 173, respectively, and the second gaps may be formed between the ends 141e to 143e of the electrodes 141 to 143 and the dummy ends 181e to 183e of the dummy electrodes 181 to 183, respectively.

In the acoustic wave device 5, for example, the end 131e of the electrode 131 may be continuously joined to the first sidewall of the depression 21 along the direction D3. Further, the dummy end 171e of the dummy electrode 171 may be continuously joined to the second sidewall of the depression 21. Similarly, the end 141e of the electrode 141 may be continuously joined to the third sidewall of the depression 31. Furthermore, the dummy end 181e of the dummy electrode 181 may be continuously joined to the fourth sidewall of the depression 31. The ratio of the top size of the first gap along the direction D1 to the bottom size of the depression 21 along the direction D1 may be between 0.8 and 1.2, and the ratio of the top size of the second gap along the direction D1 to the bottom size of the depression 31 along the direction D1 may be between 0.8 and 1.2.

In the acoustic wave device 5, energy leakage of the acoustic signal along the direction D1 may be further reduced by disposing the dummy electrodes 171 to 173 and/or 181 to 183, thereby further enhancing the quality factor of the acoustic wave device 5. In some embodiments, the materials of the dummy electrodes 171 to 173 and/or 181 to 183 include a metal, and the metal may be selected from at least one of the following: molybdenum (Mo), copper (Cu), aluminum (Al), gold (Au), platinum (Pt), tungsten (W), and a combination thereof.

For the acoustic wave devices 1 and 5, those skilled in the art may also adjust the number of electrodes 131-133 and/or the number of electrodes 141-143 to meet various application requirements without deviating from the principles of the invention.

Figure 6:
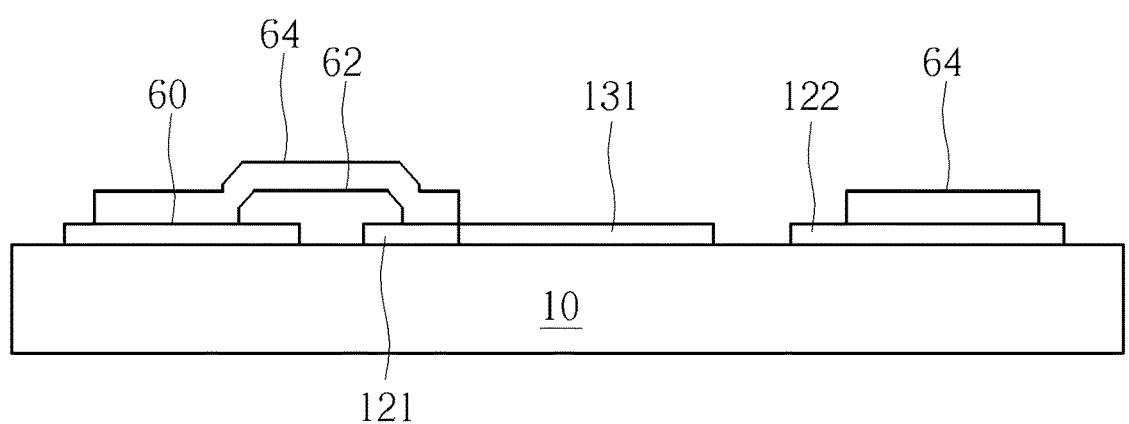
FIGS. 6 to 8 show schematic diagrams of a method of fabricating an acoustic wave device.
Figure 7:
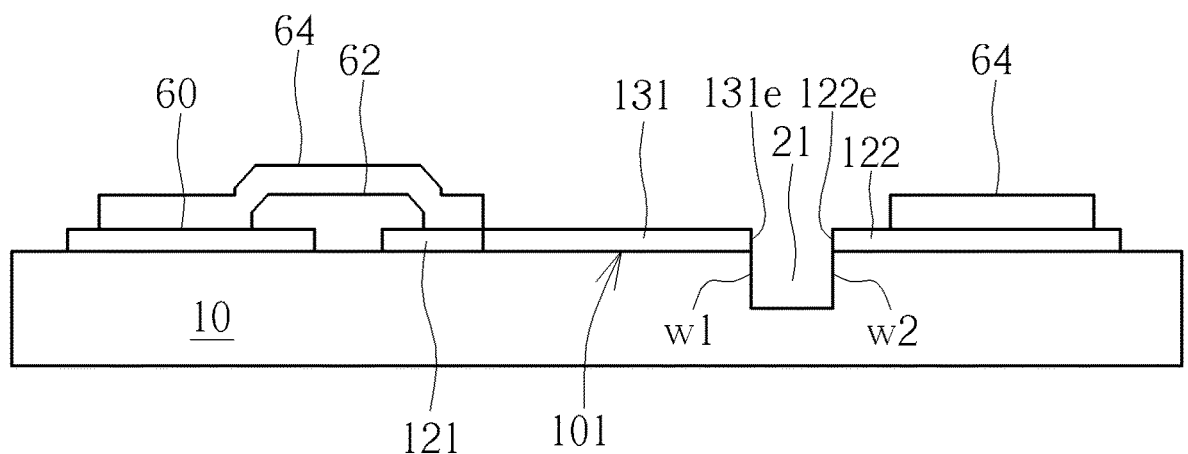
Figure 8:
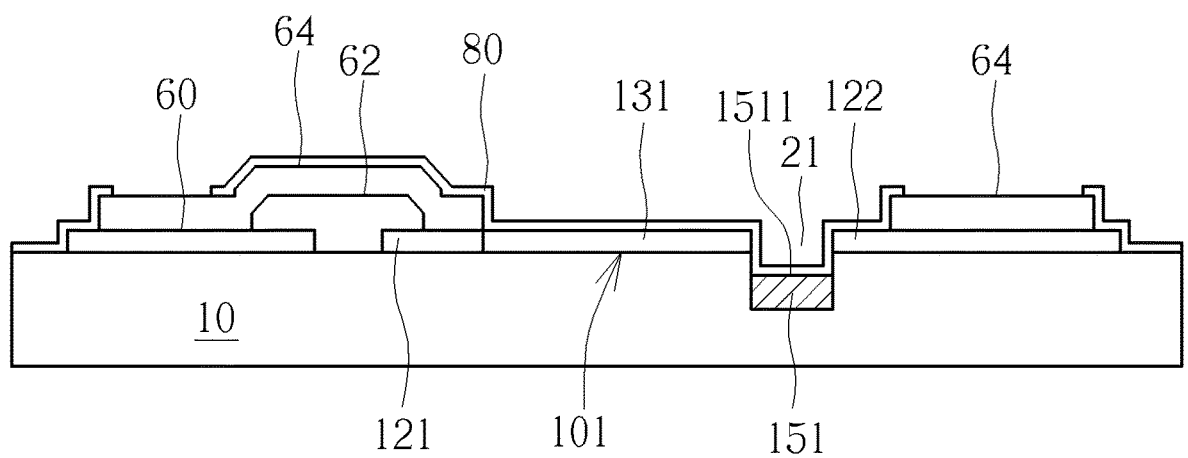

FIGS. 6 to 8 show schematic diagrams of a method of fabricating the acoustic wave device. FIG. 6 shows a piezoelectric substrate 10 and a conductive layer disposed on the surface of the piezoelectric substrate 10. The conductive layer may be patterned by ways of a patterning method to a form patterned conductive layer. In some embodiments, the patterned conductive layer may include the bus bar 121, the electrode 131, and the bus bar 122. Further, the patterned conductive layer may include a pad 60. FIGS. 6 to 8 show an exemplary structure of the transducer, and the patterned conductive layer may further include other structures.

In some embodiments, as in FIG. 7, the depression 21 may be formed in the piezoelectric substrate 10, and the depression 21 is depressed from the surface 101 of the piezoelectric substrate 10. The first sidewall w1 of the depression 21 may be continuously joined to the end 131e of the electrode 131, and the second sidewall w2 of the depression 21 may be continuously joined to the edge 122e of the bus bar 122.

In some embodiments, as in FIG. 8, the depression 21 is filled with the metal fill 151 which has the metal fill surface 1511. The distance between the surface 101 of the piezoelectric substrate 10 and the metal fill surface 1511 in the direction D3 is greater than zero.

In some embodiments, as in FIGS. 6 to 8, the method further includes forming a bridge layer 62. The bridge 62 may be at least partially located between the pad 60 and the bus bar 121. A connection layer 64 is formed to provide connection from the electrode 131, the bus bar 121, and/or the bus bar 122 to an external circuit.

In some embodiments, as in FIG. 8, the method further includes forming an insulating layer 80 to protect the acoustic wave device.

Figure 9:
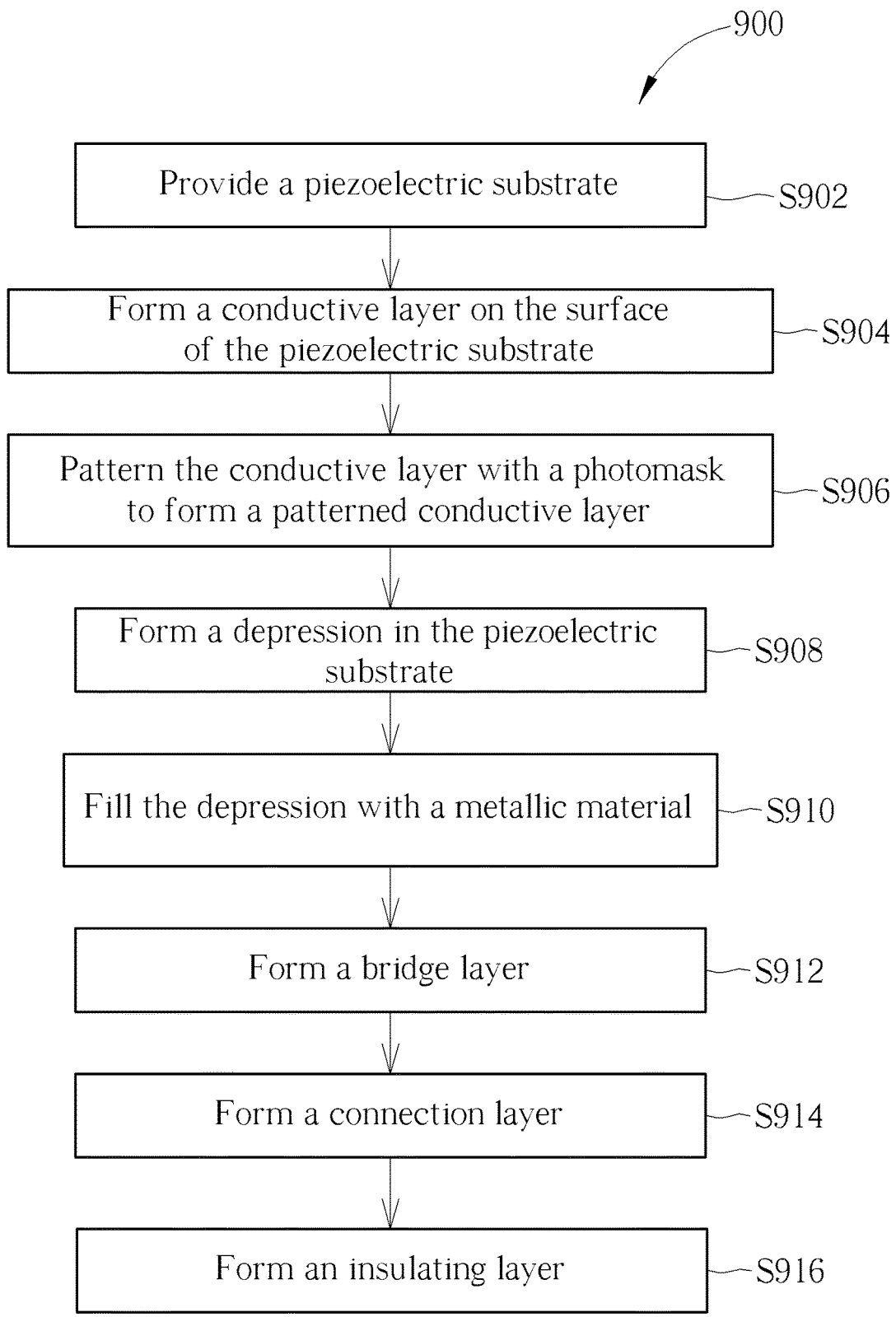
FIG. 9 is a flowchart of the method of fabricating the acoustic wave device.

FIG. 9 is a flowchart of the method 900 of fabricating the acoustic wave device 1 or 5. The method 900 includes Steps S902 to S916 for fabricating the acoustic wave device 1 or 5. Any reasonable step change or adjustment is within the scope of the present disclosure. Steps S902 to S916 are detailed as follows:

Step S902: Provide a piezoelectric substrate 10;

Step S904: Form a conductive layer on the surface 101 of the piezoelectric substrate 10;

Step S906: Pattern the conductive layer with a photomask to form the patterned conductive layer, the patterned conductive layer may include the pad 60, the bus bar 121, the electrode 131, and the bus bar 122;

Step S908: Form the depression 21 in the piezoelectric substrate 10, the depression 21 is depressed from the surface 101 of the piezoelectric substrate 10, and the first sidewall w1 of the depression 21 is continuously joined to the end 131e of the electrode 131 in the direction D3;

Step S910: Fill the depression 21 with a metallic material to form the metal fill 151;

Step S912: Form the bridge layer 62, the bridge layer 62 may be at least partially located between the pad 60 and the bus bar 121;

Step S914: Form the connection layer 64, and the connection layer 64 is used to provide connections from the electrode 131, the bus bar 121, and/or the bus bar 122 to the external circuit;

Step S916: Form the insulating layer 80, the insulating layer 80 may be located above the pad 60, the connection layer 64, the bridge layer 62, the electrode 131, the metal fill 151 and the bus bar 122.

Referring to FIG. 6, in some embodiments, in Step S906, the pad 60, the bus bar 121, the electrode 131, and the bus bar 122 may be formed simultaneously in the patterned conductive layer. In other embodiments, the dummy electrodes electrically connected to the bus bar 122 may also be formed. Referring to FIG. 7, in Step S908, the depression 21 may be formed by an etching process using a photomask. Referring to FIG. 8, in Step S910, the metal Mo may be used to form the metal fill 151 in the depression 21. The thickness of the metal fill 151 and the thickness of the patterned conductive layer may be equal or different.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An acoustic wave device comprising:
   a piezoelectric substrate having a first surface;
   a transducer disposed on the first surface of the piezoelectric substrate, the transducer comprising:
      a first bus bar extending along a second direction;
      a first electrode having a first end, and extending from the first bus bar to the first end along a first direction;
      a second bus bar extending along the second direction; and
      a second electrode having a second end and extending from the second bus bar to the second end along the first direction, wherein the second electrode and the first electrode is spaced apart in the second direction, and a first gap is formed between the first end of the first electrode and an edge of the second bus bar; and
   a first depression formed in the piezoelectric substrate and depressed from the first surface of the piezoelectric substrate, wherein the first depression has a first sidewall, and the first end of the first electrode is continuously joined to the first sidewall of the first depression in a depth direction.

2. The acoustic wave device of claim 1, wherein:
   the first depression further has a second sidewall;
   the edge of the second bus bar is continuously joined to the second sidewall of the first depression in the depth direction; and
   a ratio of a top size of the first gap along the first direction to a bottom size of the first depression along the first direction is between 0.8 and 1.2.

3. The acoustic wave device of claim 1, further comprising:
   a first metal fill filled in the first depression of the piezoelectric substrate, wherein the first metal fill has a first metal fill surface, and wherein a first distance between the first surface and the first metal fill surfaces in the depth direction is greater than 0.

4. The acoustic wave device of claim 1, wherein:
   a second gap is formed between the second end of the second electrode and an edge of the first bus bar; and
   the acoustic wave device further comprises:

a second depression formed in the piezoelectric substrate and depressed from the first surface of the piezoelectric substrate, wherein the second depression has a third sidewall, and the second end of the second electrode is continuously joined to the third sidewall of the second depression in the depth direction.

5. The acoustic wave device of claim 4, wherein:
the first depression further has a second sidewall;
the second depression further has a fourth sidewall;
in the depth direction, the edge of the second bus bar is continuously joined to the second sidewall of the first depression, and the edge of the first bus bar is continuously joined to the fourth sidewall of the second depression; and
a ratio of a top size of the first gap along the first direction to a bottom size of the first depression along the first direction is between 0.8 and 1.2, and a ratio of a top size of the second gap along the first direction to a bottom size of the second depression along the first direction is between 0.8 and 1.2.

6. The acoustic wave device of claim 4, wherein:
the transducer further comprises:
a first dummy electrode extending from the second bus bar along the first direction, and having a first dummy end, wherein the first dummy end of the first dummy electrode is aligned with the first end of the first electrode along the first direction; and
a second dummy electrode extending from the first bus bar along the first direction, and having a second dummy end, wherein the second dummy end of the second dummy electrode is aligned with the second end of the second electrode along the first direction;
wherein the first gap is formed between the first end of the first electrode and the first dummy end of the first dummy electrode; and
the second gap is formed between the second end of the second electrode and the second dummy end of the second dummy electrode.

7. The acoustic wave device of claim 6, wherein:
the first depression further has a second sidewall;
the second depression further has a fourth sidewall;
in the depth direction, the first dummy end of the first dummy electrode is continuously joined to the second sidewall of the first depression, and the second dummy end of the second dummy electrode is continuously joined to the fourth sidewall of the second depression; and
a ratio of a top size of the first gap along the first direction to a bottom size of the first depression along the first direction is between 0.8 and 1.2, and a ratio of a top size of the second gap along the first direction to a bottom size of the second depression along the first direction is between 0.8 and 1.2.

8. The acoustic wave device of claim 4, further comprising:
a first metal fill filled in the first depression of the piezoelectric substrate, the first metal fill having a first metal fill surface; and
a second metal fill filled in the second depression of the piezoelectric substrate, the second metal fill having a second metal fill surface;
wherein in the depth direction, a first distance between the first surface and the first metal fill surface is greater than 0, and a second distance between the first surface and the second metal fill surface is greater than 0.

9. The acoustic wave device of claim 8, wherein the first distance is equal to the second distance.

10. The acoustic wave device of claim 8, wherein:
the acoustic wave device is used to process an acoustic wave having a wavelength;
a first thickness of the first metal fill along the depth direction is 2% to 6% of the wavelength; and
a second thickness of the second metal fill along the depth direction is 2% to 6% of the wavelength.

11. The acoustic wave device of claim 8, wherein:
the acoustic wave device is used to process an acoustic wave having a wavelength;
the first distance is ranged between 5% and 10% of the wavelength; and
the second distance is ranged between 5% and 10% of the wavelength.

12. The acoustic wave device of claim 1, wherein the second direction is perpendicular to the first direction.

13. The acoustic wave device of claim 1, wherein materials of the first electrode, the second electrode, the first bus bar, and the second bus bar comprises a metal, and the metal is selected from at least one of molybdenum (Mo), copper (Cu), aluminum (Al), gold (Au), platinum (Pt), tungsten (W), and a combination thereof.

14. The acoustic wave device of claim 1, wherein a size of the first depression along the second direction is equal to, less than, or greater than a size of the first electrode along the second direction.

15. The acoustic wave device of claim 1, wherein the first electrode is parallel to the second electrode, and the first bus bar is parallel to the second bus bar.

16. A method of fabricating an acoustic wave device, the method comprising:
providing a piezoelectric substrate, the piezoelectric substrate having a first surface;
forming a conductive layer on the first surface;
patterning the conductive layer to form a patterned conductive layer, wherein the patterned conductive layer comprises:
a first bus bar extending along a second direction;
a first electrode having a first end and extending from the first bus bar to the first end along a first direction;
a second bus bar extending along the second direction; and
a second electrode having a second end and extending from the second bus bar to the second end along the first direction, wherein the second electrode and the first electrode is spaced apart in the second direction, and a first gap is formed between the first end of the first electrode and an edge of the second bus bar; and
forming a first depression in the piezoelectric substrate, wherein the first depression is depressed from the first surface of the piezoelectric substrate, the first depression has a first sidewall, and the first end of the first electrode is continuously joined to the first sidewall of the first depression in a depth direction.

17. The method of claim 16, further comprising:
filling a first metal fill in the first depression, wherein the first metal fill has a first metal fill surface, and a first distance between the first surface and the first metal fill surface in the depth direction is greater than 0.

18. The method of claim 17, wherein:
the patterned conductive layer further comprises:
a first dummy electrode extending from the second bus bar along the first direction and having a first dummy end, wherein the first dummy end of the first dummy electrode is aligned with the first end of the first electrode along the first direction; and a second dummy electrode extending from the first bus bar along the first direction and having a second dummy end, wherein the second dummy end of the second dummy electrode is aligned with the second end of the second electrode along the first direction, and wherein the first gap is formed between the first end of the first electrode and the first dummy end of the first dummy electrode, and a second gap is formed between the second end of the second electrode and the second dummy end of the second dummy electrode;

the method further comprises:

forming a second depression in the piezoelectric substrate, wherein the second depression is depressed from the first surface of the piezoelectric substrate, the second depression has a third sidewall, and the second end of the second electrode is continuously joined to the third sidewall of the second depression in a depth direction; and filling a second metal fill in the second depression, the second metal fill having a second metal fill surface, and a second distance between the second surface and the second metal fill surface in the depth direction is greater than 0.

19. The method of claim 18, wherein:

the first depression further has a second sidewall;

the second depression further has a fourth sidewall;

the first dummy end of the first dummy electrode is continuously joined to the second sidewall of the first depression in the depth direction;

the second dummy end of the second dummy electrode is continuously joined to the fourth sidewall of the second depression; and a ratio of a top size of the first gap along the first direction to a bottom size of the first depression along the first direction is between 0.8 and 1.2, and a ratio of a top size of the second gap along the first direction to a bottom size of the second depression along the first direction is between 0.8 and 1.2.

20. The method of claim 18, wherein:

the first metal fill has a first metal fill surface; and the second fill metal has a second fill metal surface; and wherein in the depth direction, a first distance between the first surface and the first metal fill surface is greater than 0, and a second distance between the first surface and the second metal fill surface is greater than 0.

* * * * *